United States Patent [19]

Croitoru et al.

[11] Patent Number: 4,764,398
[45] Date of Patent: Aug. 16, 1988

[54] METHOD OF DEPOSITING COATINGS ON THE INNER SURFACE OF A TUBE BY CHEMICAL VAPOR DEPOSITION

[75] Inventors: Natan Croitoru, Kfar Saba; Guy Deutscher, Herzliya Pituach; Enrique Gruenbaum, Kfar Saba, all of Israel

[73] Assignee: Ramot University Authority for Applied Research and Industrial Development Ltd., Tel Aviv, Israel

[21] Appl. No.: 847,248

[22] Filed: Apr. 2, 1986

[30] Foreign Application Priority Data

Apr. 2, 1985 [IL] Israel ......................................... 74787

[51] Int. Cl.⁴ .................... C23C 16/30; C23C 16/40
[52] U.S. Cl. ..................................... 427/237; 427/255; 427/255.2; 427/255.3
[58] Field of Search .................. 427/237, 255.2, 255.3, 427/255, 126.3, 427; 118/DIG. 10, 715, 719, 725, 730, 724, 728

[56] References Cited

U.S. PATENT DOCUMENTS

| | | | |
|---|---|---|---|
| 4,117,802 | 10/1978 | Le Sergent et al. | 427/237 |
| 4,206,252 | 6/1980 | Gordon | 427/255.3 |
| 4,217,027 | 8/1980 | MacChesney et al. | 427/237 |
| 4,235,616 | 11/1980 | Siegfried | 427/237 |
| 4,312,654 | 1/1982 | Sarkar | 427/237 |
| 4,417,911 | 11/1983 | Cundy et al. | 427/237 |
| 4,592,307 | 6/1986 | Jolly | 118/719 |

Primary Examiner—Sadie L. Childs
Attorney, Agent, or Firm—Benjamin J. Barish

[57] ABSTRACT

A method of depositing a heat reflecting coating on the inner surface of a tube comprises: introducing the tube into the second zone of a furnace having two temperature zones; injecting into the first zone a mixture of chemicals capable of reacting to form the coating material; simultaneously injecting into the first zone towards the second zone a plurality of jets of a carrier gas defining an annular array of jets around the first jet, and a further jet of a carrier gas also substantially parallel to the first jet but spaced closer thereto; controlling the temperature of the first zone to effect vaporization of the mixture in the first jet; and controlling the temperature of the second zone to effect the reaction of the vaporized materials of the mixture to form the coating material, and the deposition of the coating material on the surface of the tube in the second zone.

11 Claims, 2 Drawing Sheets

METHOD OF DEPOSITING COATINGS ON THE INNER SURFACE OF A TUBE BY CHEMICAL VAPOR DEPOSITION

BACKGROUND OF THE INVENTION

The present invention relates to a method of depositing coatings on a substrate, particularly heat reflective coatings useful in making high temperature solar collector absorbers. The invention also relates to apparatus for practicing such method, and solar collectors made in accordance with such method.

One known form of high temperature solar collector absorber includes an inner tube for conducting the working fluid and having an absorber coating thereon, and an outer transparent tube coaxial with the inner tube and separated therefrom by an annular vacuum space. The solar collector further includes a mirror receiving the solar radiation and reflecting it through the outer transparent tube onto the absorber coating of the inner tube for heating the working fluid flowing through the inner tube. The working fluid may thus be heated to very high temperatures, over 200° C. Because of these high temperatures, the absorber coating may be of the selective type to reduce radiation losses from the working fluid back to the atmosphere.

SUMMARY OF THE INVENTION

An object of the present invention is to provide a method of depositing a coating onto a substrate which method is paticularly useful in depositiong coatings for high temperature solar collections of this type. Another object of the invention is to provide apparatus for practicing the novel method.

According to the present invention, there is provided a method of depositing a coating of a material onto the inner surface of a tube by chemical vapor deposition. The method uses a furnace having a first temperature zone and a second, higher, temperature zone. The tube is introduced into the second temperature zone, and a mixture of chemical materials, capable of reacting to form the coating material, is injected into the first zone towards the second zone in the form of a first high-velocity jet substantially parallel to the surface of the tube to be coated. Simultaneously therewith are injected into the first zone, towards the second zone, an annular array of jets of a carrier gas around the first jet and substantially parallel thereto, and a further jet of a carrier gas also substantially parallel to the first jet but spaced closer thereto than those of the annular array. The temperature of the first zone is controlled so as to be sufficiently high to effect therein vaporization of the mixture in the first jet; while the temperature of the second zone is controlled so as to be above the reaction temprature of the mixture of chemical materials. This results in the chemical reaction of the vaporized materials of the mixture on the surface of the tube in the second zone, to thereby form the coating material as a deposit on the surface of the tube.

In the preferred embodiment of the invention described below, the mixture comprises $SnCl_4$ and $InCl_3$ dissolved in a solvent and capable of reacting to form a transparent homogeneous heat-reflecting film of an $(In_2O_3)_{4-x} \cdot (SnO_2)_x$ complex, particularly with $x=0.09$.

Such coatings, and the above-described method of depositing them, are particularly useful in making solar collectors of the type including an inner tube for conducting a working fluid and having an absorber coating thereon, and an outer transparent tube coaxial with the inner tube and separated therefrom by an annular vacuum space. The above-described novel method is particularly useful for depositing a coating on the inner face of the outer tube which coating is substantially transparent to visible and ultraviolet radiation but substantially reflective to infrared radiation. Such a coating, therefore, decreases the heat losses resulting by re-radiation from the working fluid within the inner tube, and thereby significantly increases the overall efficiency of the solar collector.

The invention also provides novel apparatus for performing the above-described method of depositing coatings.

Further feature and advantages of the invention will be apparent from the description below.

BRIEF DESCRIPTION OF THE DRAWINGS

The invention is herein described, by way of example only, with reference to the accompanying drawings, wherein.

DESCRIPTION OF A PREFERRED EMBODIMENT

Figure 1:
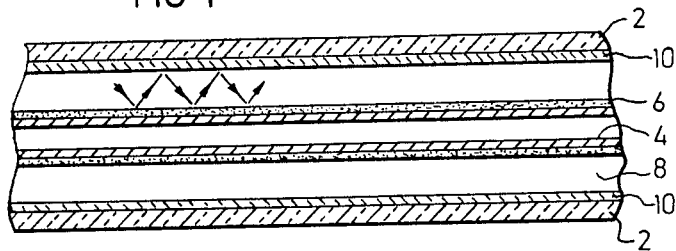
FIG. 1 is a transverse sectional view diagrammatically illustrating one form of solar collector constructed in accordance with the present invention.

The solar collector illustrated in FIG. 1 comprises an outer tube 2, e.g. of glass, transparent to solar radiation, and an inner tube 4 for conducting the working fluid to be heated by the solar radiation. The working fluid may be a gas or a liquid. In high temperature application, it is usually a liquid oil. The inner tube 4 is usually of metal and provided with a blackened absorber coating 6 on its outer surface. The inner tube 4 is coaxial with the outer transparent tube 2 and is separated therefrom by an annular vacuum space 8 to minimize heat losses by conduction. As indicated earlier, the absorber coating 6 on the outer face of the inner tube 4 may be selective so as to reduce heat losses by radiation back to the atmosphere from the working fluid within the inner tube.

According to one aspect of the present invention, the inner face of the outer transparent tube 2 is provided with a coating 10 which is substantially transparent to visible and ultraviolet radiation but is substantially reflective to infrared radiation. Thus, infrared radiation emitted by the hot working fluid within the inner tube 4 and its absorber coating 6 will not be transmitted through the outer transparent tube 2, but rather will be reflected back to the inner tube 4 conducting the hot working fluid. Coating 10 thus reduces the heat losses by radiation, and thereby increases the overall efficiency of the solar collector. The transition wavelength can be adjusted by suitable doping of the chemical substances in coating 10.

The preferred material for coating 10 is indium tin oxide, more particularly the complex of $(In_2O_3)_{4-x} \cdot (SnO_2)_x$, particularly the complex wherein $x=0.09$.

Figure 3:
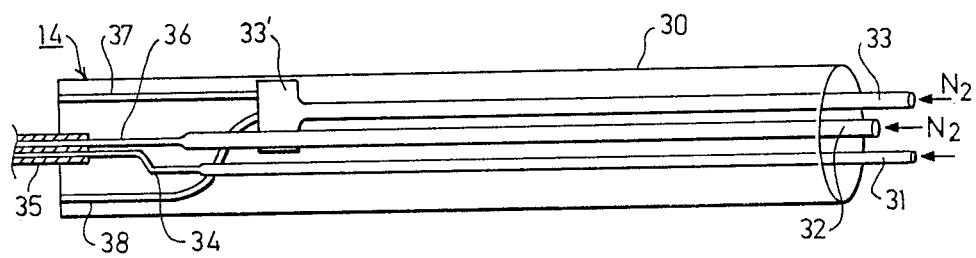
FIG. 3 diagrammatically illustrates the construction of the spray gun in the apparatus of FIG. 2 for injecting the various materials into the furnace.
Figure 4:
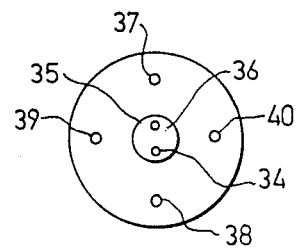
FIG. 4 is an end view diagrammatically illustrating the construction of the spray gun of FIG. 3.
Figure 2:
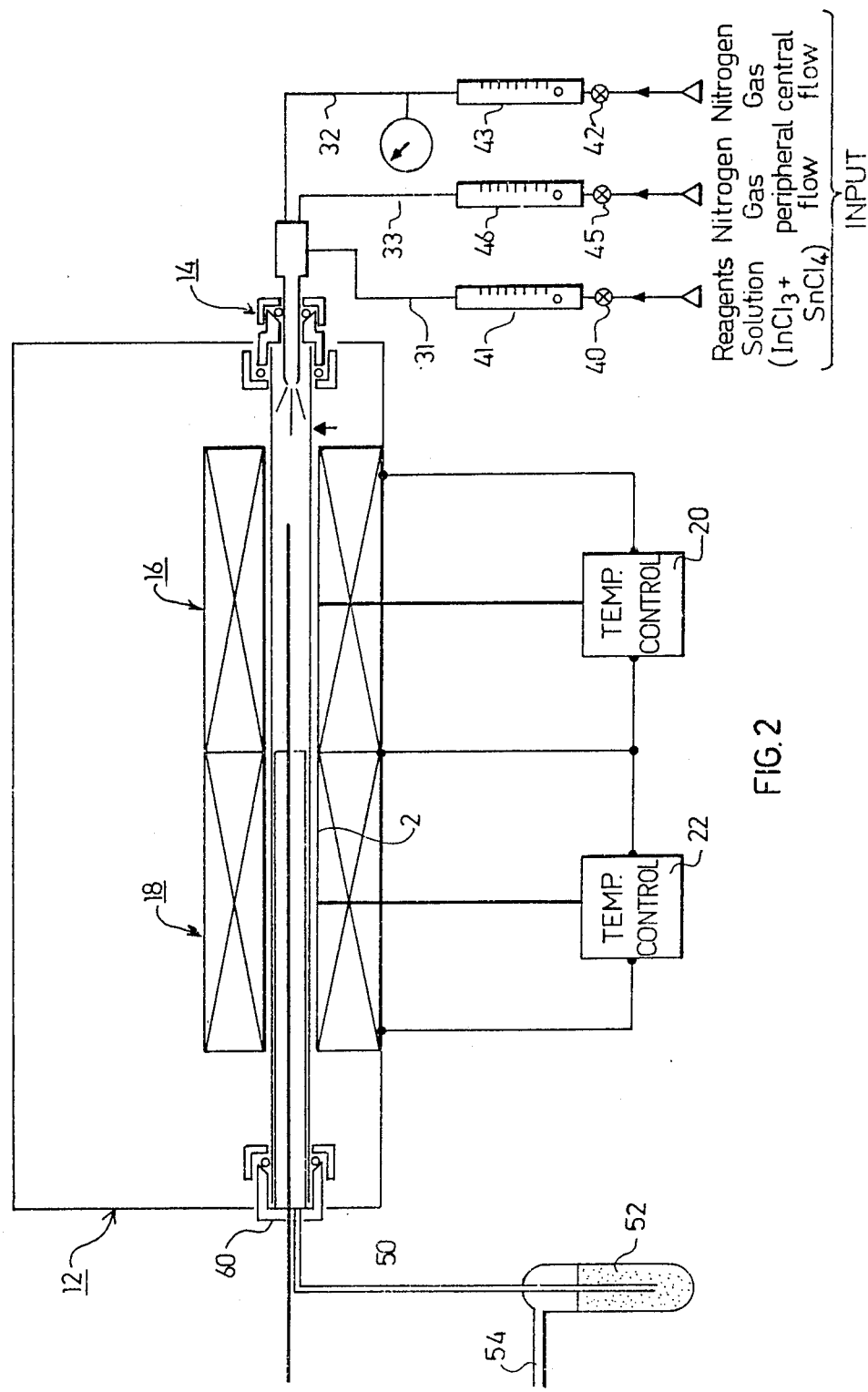
FIG. 2 diagrammatically illustrates the apparatus for use in depositing the infrared-radiation-reflecting coating on the inner face of the outer tube in the solar collector of FIG. 1.

FIGS. 2–4 illustrate a preferred method and apparatus for applying coating 10 to the inner face of transparent tube 2 of the solar collector illustrated in FIG. 1.

The apparatus illustrated in FIG. 2 includes a furnace, generally designated 12, having a spray gun 14 at one end for introducing the material to form coating 10 of the solar collector illustrated in FIG. 1. Furnace 12 includes a first temperature zone 16 at the inlet end of the furnace adjacent to spray gun 14, and a second temperature zone 18 downstream of zone 16 in the direction of movement of the material injected by the spray gun. The temperature of zone 16 is controlled by a control unit, schematically indicated at 20, to effect vaporization of the coating mixture injected by spray gun 14, and is therefore called a vaporization zone; whereas the temperature of zone 18 is controlled by a temperature control unit 22 to effect therein the reaction of the materials injected from spray gun 14 after vaporization in zone 16, such materials reacting in zone 18 to form the coating material which is deposited in zone 18 onto the substrate to be coated.

In this case, the substrate to be coated is the inner face of the outer transparent tube 2 of the absorber, i.e., the converting part of the solar collector illustrated in FIG. 1. Tube 2 is introduced into furnace 12 and is located in the reaction and deposition zone 18 of the furnace with its inner face exposed to the material injected by spray gun 14.

The construction of spray gun 14 is more particularly illustrated in FIGS. 3 and 4. It includes a tubular head 30 enclosing three inlet tubes, namely tube 31 for inletting the coating material in the form of a mixture, and two further inlet tubes 32, 33, for inletting a carrier gas, preferably an inert gas.

Tube 31 for inletting the coating mixture leads to a smaller-diameter tubelet 34 passing through a stem 35 projecting from the inner face of spray gun 14. Tube 32 for inletting a carrier gas leads to another tubelet 36 also passing through stem 35 projecting from the inner face of the spray gun and slightly spaced in the radial direction from tubelet 34. Tubelet 33, also for inletting a carrier gas, is joined, at juncture 33′ within head 30, to four tubelets 37, 38, 39 and 40, arranged in an annular array around stem 35. The latter four tubelets terminate at the end of the inlet face of head 30 and are therefore effectively recessed with respect to the ends of tubelets 34 and 36 passing through the projecting stem 35.

FIG. 4, illustrating the inner face of spray gun 14, shows the above-described disposition of the tubelets.

The coating mixture inletted via tube 32 is injected through tube 34 into zone 16 of furnace 12 in the form of a high velocity jet substantially parallel to the surface of the substrate, i.e., transparent tube 2, to be coated; the latter tube is located in zone 18 of the furnace. The carrier gas inletted into tube 32 is injected via its tubelet 36 as a further high velocity jet substantially parallel to the coating mixture jet issuing from tubelet 34 and is closely spaced to it, as shown particularly in FIG. 4. The carrier gas inletted via tube 33 is injected via tubelets 37–40 in the form of an annular array of jets around the jets issuing from tubelets 34 and 36, and substantially parallel to those jets, as also shown in FIG. 4.

The jet of carrier gas issuing from tubelet 35 is effective to atomize the jet of coating material issuing from tubelet 34 so as to enhance the vaporization of the coating material within the vaporization zone 16 of furnace 12. The annular array of jets of carrier gas issuing from tubelets 37–40 are effective to confine the atomized and vaporized coating material as it passes through the vaporization zone 16 into the chemical reaction and deposition zone 18 so that the coating material is received as a confined stream or jet within the transparent tube 2 located in zone 18. Since the outlet ends of tubelets 37–40 are recessed with respect to the outlet ends of tubelets 34 and 36, defined by the inner face of stem 35, the foregoing annular array of jets begins to spread towards each other in the annular direction before these jets reach the outlet ends of tubelets 34 and 36. This arrangement better confines the jets issuing from those tubelets.

The rate of inletting of the coating mixture into its inlet 31 is controlled by valve 40 (FIG. 2) and is indicated by flow meter 41. Similarly, the rate of inletting of the carrier gas into the central or atomizing inlet 32 is controlled by valve 42 and is indicated by flow meter 43 and also by pressure meter 44. The rate of inletting of the carrier gas into tube 33 of the spray gun 14 for producing the annular array of jets is controlled by valve 45 and is indicated by flow meter 46.

The gas products produced by the reaction of the coating mixture within zone 18 of furnace 12 are removed from furnace 12 via an outlet pipe 50 and are bubbled through a solution within a container 52 before being discharged via outlet 54.

Preferably, the coating to be applied to the inner face of transparent tube 2 in zone 18 of furnace 12 is a mixture of $SnCl_4$ and $InCl_3$ dissolved in a solvent, a preferred solvent being one including alcohol, hydrochloric acid and water. This mixture is vaporized in the vaporization zone 16 of the furnace and then reacts in zone 18 e.g., according to the following chemical reaction:

(1) $SnCl_4 + 2H_2O \; SnO_2 + 4HCl$
(2) $2InCl_3 + 3H_2O \; In_2O_3 + 6HCl$

The purpose of adding alcohol and HCl to the water is to slow down these reactions in order that they take place only in the reaction zone 18 of FIG. 2.

The $In_2O_3$ and $SnO_2$ produce an 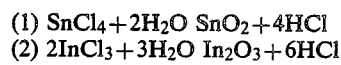 $(In_2O_3)_{4-x} \cdot (SnO_2)_x$ complex wherein $x = 0.09$, in the form of a homogeneous film which is transparent to visible and ultraviolet radiation but is substantially reflective to infrared radiation. This film, constituting coating 10 on the inner face of transparent tube 2 of the solar collector illustrated in FIG. 1, thereby permits the visible and ultraviolet radiations to pass therethrough, but reflects the infrared radiation emitted by the hot working fluid within the inner tube 4 back to the inner tube, thereby decreasing the radiation losses and increasing the efficiency of the solar collector.

Vaporization zone 16 of furnace 12 is controlled to maintain a temperature in that zone between 340°–370° C.; and the reaction and deposition zone 18 is controlled to maintain a slightly higher temperature, preferably between 360°–380° C. Particularly good results have been produced when the temperature within zone 16 was 350°–360° C. and that within zone 18 was about 370° C.

Preferably, the coating mixture is injected via inlet tube 31 at a rate of about 0.25–0.50 cc/min.; a rate of about 0.35 cc/min was found particularly effective. The carrier gas inletted via tubes 32 and 34 is preferably nitrogen. This gas is inletted via tube 32 to form the central gas jet at a rate of about 1500–2000 cc/min, preferably about 1800 cc/min; and the gas is inletted into tube 33 to form the annular array of gas jets at a rate of 3000–4000 cc/min, preferably about 3700 cc/min.

The coating 10 deposited by practicing the above-described method is preferably of a thickness of 0.3 to 3.0 μm, a coating thickness of about 1.0 μm having been found particularly effective.

Following is one preferred example for practicing the above-described method.

A mixture of SnCl₄ and InCl₃, in mass ratio of 7.5/100, is dissolved in a solvent composed of alcohol (20% by weight) and hydrochloric acid in water, the latter being at a ratio of 1:29. The total mass dissolved is about 0.15 gr/cc.

This solution is inletted into the inlet tube 31 of spray gun 14 at a rate of 0.35 cc/min.

Simultaneously with the inletting of the coating solution, there is also inletted nitrogen at a pressure of 3.5 atmospheres, via inlet 32 at a rate of about 1800 cc/min, and via inlet 33 at a rate of about 3700 cc/min.

The evaporation zone 16 in furnace 12 is maintained at a temperature of 350°–360° C., and the reaction and deposition zone 18 within the furnace is maintained at a temperature of about 370° C.

The total deposition time is about one hour for a coating thickness of 1 μm.

The apparatus illustrated in FIG. 2 further includes means comprising a rotatable coupling 60 for rotating tube 2 within zone 18 of the furnace to obtain a homogeneous coating on the tube, and for moving the tube longitudinally within the furnace to obtain coated tubes of any length. The apparatus may also include a mask applied inside the tube so as to apply the coating material on any selected areas thereof.

While the invention has been described with respect to one preferred embodiment, it will be appreciated that many other variations, modifications and applications of the invention may be made.

What is claimed is:

1. A method of depositing by chemical vapor deposition a coating of a material onto the inner surface of a tube comprising:
    introducing said tube into a furnace having a first temperature zone and a second temperature zone downstream of said first zone, said tube being introduced into said second temperature zone;
    injecting into said first temperature zone a mixture of chemical materials capable of reacting at a predetermined high temperature to form said coating material, said mixture being injected into said first zone towards said second zone in the form of a first high-velocity jet substantially parallel to the surface of the tube to be coated therewith in said second zone;
    simultaneously injecting into said first zone towards said second zone a plurality of jets of a carrier gas defining an annular array of jets around said first jet and substantially parallel thereto, and a further jet of a carrier gas also substantially parallel to said first jet but spaced closer thereto than those of said annular array;
    controlling the temperature of said first zone so as to be sufficiently high to effect therein vaporization of the mixture in said first jet;
    and controlling the temperature of said second zone so as to be above said predetermined high temperature to effect the chemical reaction of the vaporized materials of said mixture at the surface of said tube in said second zone to form said coating material as a deposit on the surface of the tube.

2. The method according to claim 1, wherein said mixture comprises SnCl₄ and InCl₃ dissolved in a solvent and capable of reacting to form a transparent homogeneous film of $(In_2O_3)_{4-x} \cdot (SnO_2)_x$ complex.

3. The method according to claim 2, wherein said solvent includes alcohol and water.

4. The method according to claim 3, wherein said solvent further includes HCl.

5. The method according to claim 4, wherein said solvent is composed of 80% by weight of alcohol and 20% HCl in water according to the ratio of 1:29 to provide a total dissolved mass of 0.15 gr/cc.

6. The method according to claim 1, wherein said first jet of the coating material is injected at a rate of about 0.25–0.50 cc/min., said annular array of jets of carrier gas are injected at a rate of 3000–4000 cc/min., and said further jet of carrier gas is injected at a rate of 1500–2000 cc/min.

7. The method according to claim 6, wherein said first jet of the coating material is injected at a rate of about 0.35 cc/min., said annular array of jets of carrier gas are injected at a rate of about 3700 cc/min., and said further jet of carrier gas is injected at a rate of 1800 cc/min.

8. The method according to claim 1, wherein said carrier gas is nitrogen.

9. The method according to claim 1, wherein the temperature of said first zone is controlled to be between 340°–370° C., and the temperature of said second zone is controlled to be higher than that of said first zone and between 360°–380 C.

10. The method according to claim 9, wherein the temperature of said first zone is controlled to be approximately 350°–360° C., and the temperature of said second zone is controlled to be approximately 370° C.

11. The method according to claim 1, wherein the coating deposited is of a thickness of 0.3 to 1.0 μm.

* * * * *